(12) United States Patent
Liu (10) Patent No.: US 9,385,727 B2
(45) Date of Patent: Jul. 5, 2016

(54) AUTOMATED LOAD TRACKING AND SYSTEM TUNING MECHANISM FOR WIRELESS CHARGING

(71) Applicant: Honeywell International Inc., Morristown, NJ (US)

(72) Inventor: Haiyang Liu, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 151 days.

(21) Appl. No.: 14/218,349

(22) Filed: Mar. 18, 2014

(65) Prior Publication Data

US 2015/0270841 A1 Sep. 24, 2015

(51) Int. Cl.
| | |
|---|---|
| *H02J 7/00* | (2006.01) |
| *H03L 7/06* | (2006.01) |
| *H02J 7/02* | (2016.01) |
| *H02J 17/00* | (2006.01) |
| *H01F 38/14* | (2006.01) |

(52) U.S. Cl.
CPC *H03L 7/06* (2013.01); *H01F 38/14* (2013.01); *H02J 7/025* (2013.01); *H02J 17/00* (2013.01); *H02J 50/12* (2016.02); *H02J 50/40* (2016.02); *Y10T 307/406* (2015.04)

(58) Field of Classification Search
CPC .......... B60L 11/182; H02J 5/005; H02J 7/025
USPC ................. 320/107–105, 119, 125–126, 141; 307/104
See application file for complete search history.

(56) References Cited

U.S. PATENT DOCUMENTS

| | | | |
|---|---|---|---|
| 2011/0080056 A1* | 4/2011 | Low ................. | H02J 5/005 307/104 |
| 2012/0104998 A1* | 5/2012 | Takada ............. | B60L 11/182 320/108 |
| 2012/0169137 A1* | 7/2012 | Lisi ................. | H02J 5/005 307/104 |
| 2012/0235508 A1* | 9/2012 | Ichikawa .......... | H02J 7/0021 307/104 |
| 2012/0235509 A1* | 9/2012 | Ueno ............... | H02J 5/005 307/104 |
| 2012/0262108 A1 | 10/2012 | Olson et al. | |
| 2013/0033118 A1 | 2/2013 | Karalis et al. | |
| 2014/0232197 A1* | 8/2014 | Keeling ............ | H04B 5/0037 307/83 |
| 2014/0240057 A1* | 8/2014 | Low ................. | H04B 5/0037 333/32 |

FOREIGN PATENT DOCUMENTS

| | | |
|---|---|---|
| EP | 2405556 A1 | 1/2012 |
| JP | 2000-049655 A | 2/2000 |

OTHER PUBLICATIONS

"European Application Serial No. 15157680.8, Extended European Search Report mailed Aug. 24, 2015", 9 pgs.

\* cited by examiner

*Primary Examiner* — Paul Dinh
(74) *Attorney, Agent, or Firm* — Schwegman Lundberg & Woessner, P.A.

(57) ABSTRACT

A system includes at least one active energy transfer coil and a first passive energy transfer coil. The active energy transfer coil is configured to couple with a power supply. The at least one active energy transfer coil has an active coupling range. The first passive energy transfer coil is magnetically coupled to the active energy transfer coil and is located within the active coupling range. The first passive energy transfer coil has a passive coupling range. The first passive energy transfer coil is configured to provide energy to a first device located within the passive coupling range and based on energy received from the at least one active energy transfer coil.

9 Claims, 8 Drawing Sheets

AUTOMATED LOAD TRACKING AND SYSTEM TUNING MECHANISM FOR WIRELESS CHARGING

BACKGROUND

Wireless devices and systems, such as those used for information communication, rely on battery power. When depleted, batteries are replaced or recharged. Battery replacement is costly and battery recharging typically entails a physical electrical connection with metered line service. A connection with a metered line service requires that the device remain tethered by a cord and this can be inconvenient.

Current technology for wireless power, while it removes the restrictions imposed by a corded connection, is often times severely limited due to the close proximity and accurate alignment that are required between transmitter and receiver. These limitations can significantly impair the widespread adoption of wireless power technology.

In magnetic resonant coupling based wireless charging systems, energy transfer efficiency heavily depends on how the driving frequency, the transmitter resonant frequency and the receiver resonant frequency match each other, especially since the transmitter and receiver typically use high Q factor coils.

Fixing driving frequency based on a static system design and the system's intrinsic resonant frequency often severely degrades end to end energy transfer efficiencies. Therefore, maximum distances and misalignment tolerances of coils in conventional wireless energy systems can limit the system's applicability in many applications. In addition, it can become overly expensive to produce in high volumes wireless energy transfer systems that maintain precise static natural frequencies in the high-Q resonators that are typically fabricated for conventional wireless energy transfer systems.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

An example of the present subject matter is directed to systems and methods for wireless energy transfer.

Figure 1:
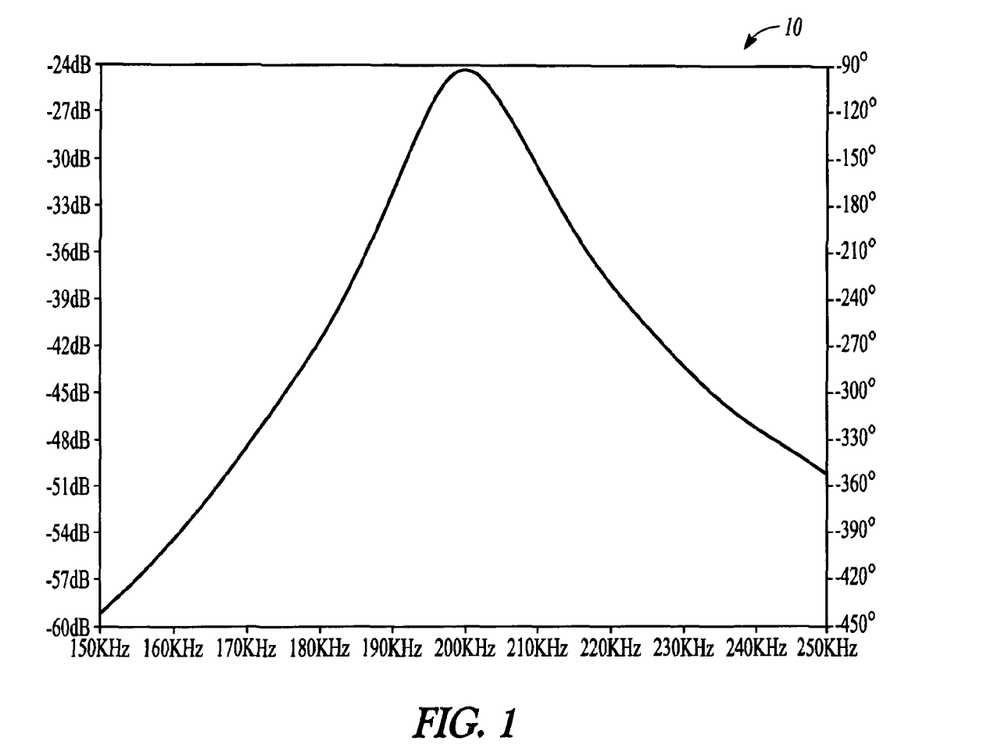
FIG. 1 illustrates a plot of a frequency response of a resonantly coupled energy transfer system (coupling coefficient ~8%) with a 5 ohm designed load.

FIG. 1 illustrates a plot 10 of a frequency response of a resonantly coupled energy transfer system (coupling coefficient ~8%) with a 5 ohm designed load. The system's end to end efficiency is maximized at the system's resonant frequency at around 200 KHz.

Figure 2:
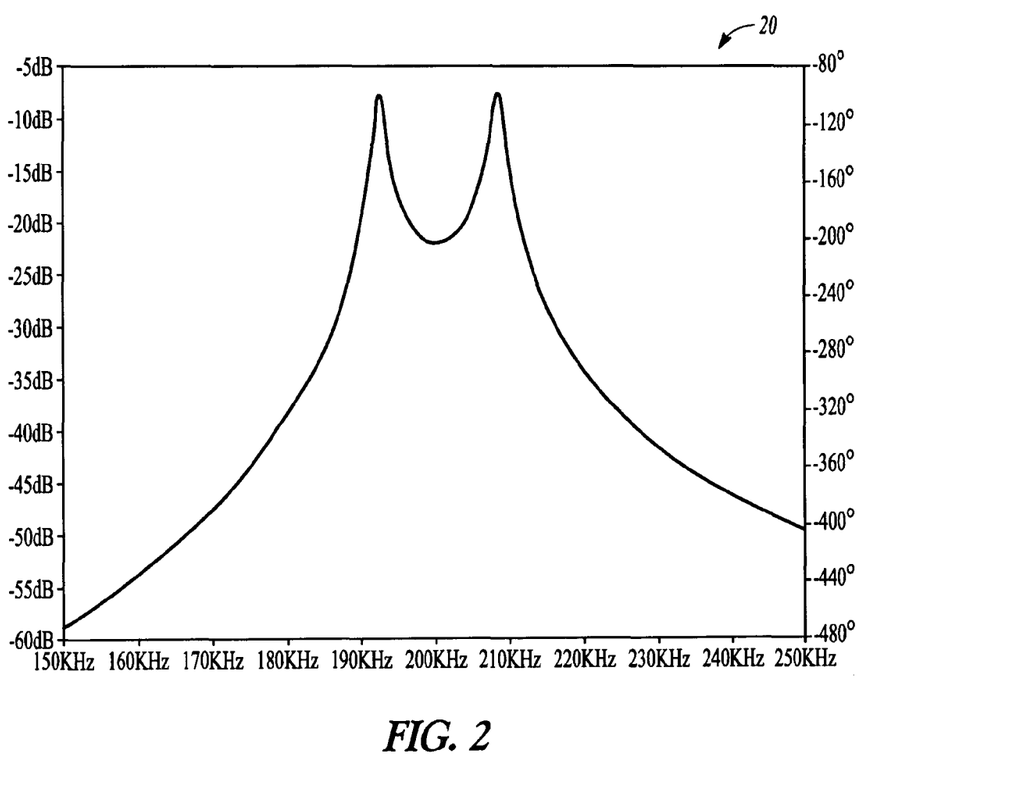
FIG. 2 is a plot similar to FIG. 1 where the load has been changed to 0.1 ohm.
Figure 3:
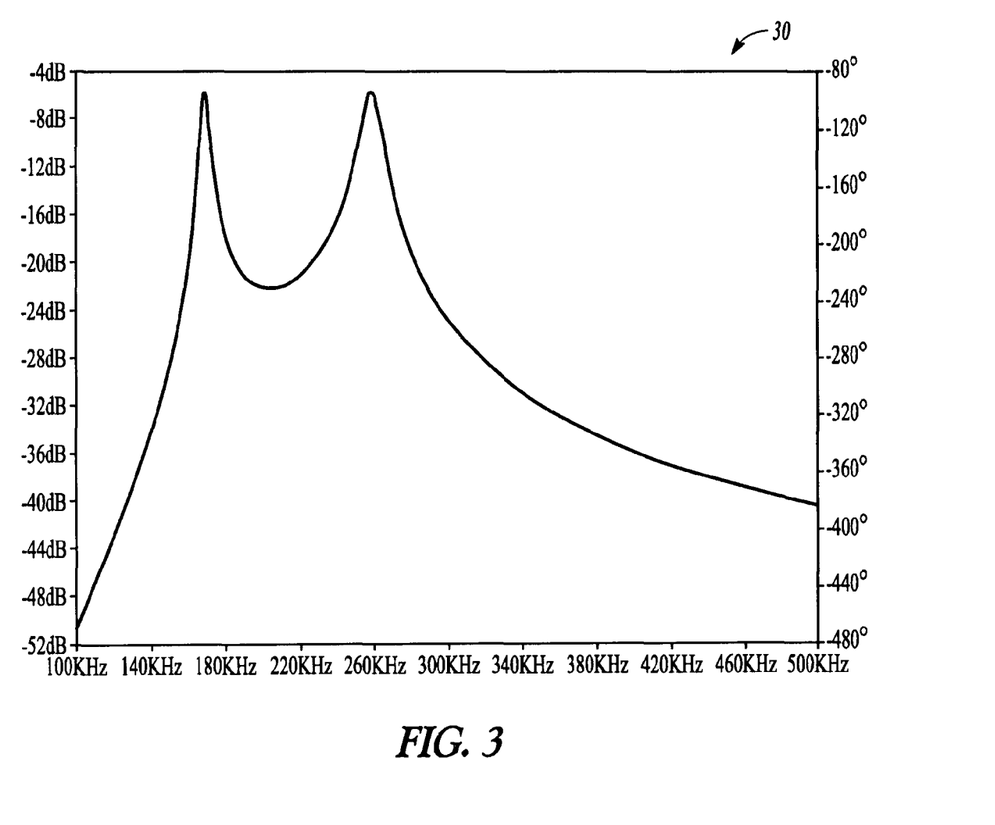
FIG. 3 is a plot similar to FIG. 1 where energy transfer system has a 40% coupling coefficient.

FIG. 2 is a plot 20 similar to FIG. 1 where the load has been changed to 0.1 ohm. FIG. 3 is a plot 30 similar to FIG. 1 where energy transfer system has a 40% coupling coefficient.

FIGS. 2 and 3 show that the system's peak performance frequency drifts away from the system's intrinsic resonant frequency. This drifting of the system's peak performance frequency demonstrates how traditional Phase Lock Loop (PLL) based frequency tuning alone may not sufficiently maximize power provided to the transmitting coil by adjusting the driving frequency to the system intrinsic frequency.

Adjusting the driving frequency to the system intrinsic frequency may not be optimal because the load and/or coupling of the energy transfer system may be operating differently than at the designed operating point. The methods described herein may utilize receiver side feedback to set driving frequency to maximize received power and end to end system efficiency.

The methods described herein may be used in a charging system for hand-held mobile devices, such as cellular telephones and smart appliances. In addition, the methods described herein may be utilized in a variety of commercial, military, and industrial applications. Other applications are also contemplated, including those not requiring line-of-sight visualization and precise tracking.

When an energy transfer system is operating, the effective resonant frequency of the different components that form the energy transfer system may dynamically change with (i) varying loads on components; and/or (ii) changing temperature. Therefore, the peak energy transfer efficiency may be offset from the system's natural resonant frequency. In addition, contrary to the techniques used in conventional methods, the best driving frequency for maximizing end to end energy transfer efficiency may dynamically change depending on relative distances and orientations between the transmitting and receiving coils. The methods described herein may address these issues by using an automatic driving frequency tuning mechanism that dynamically scans and tunes an energy transfer system's operating frequency to maximize end to end efficiency.

Figure 4:
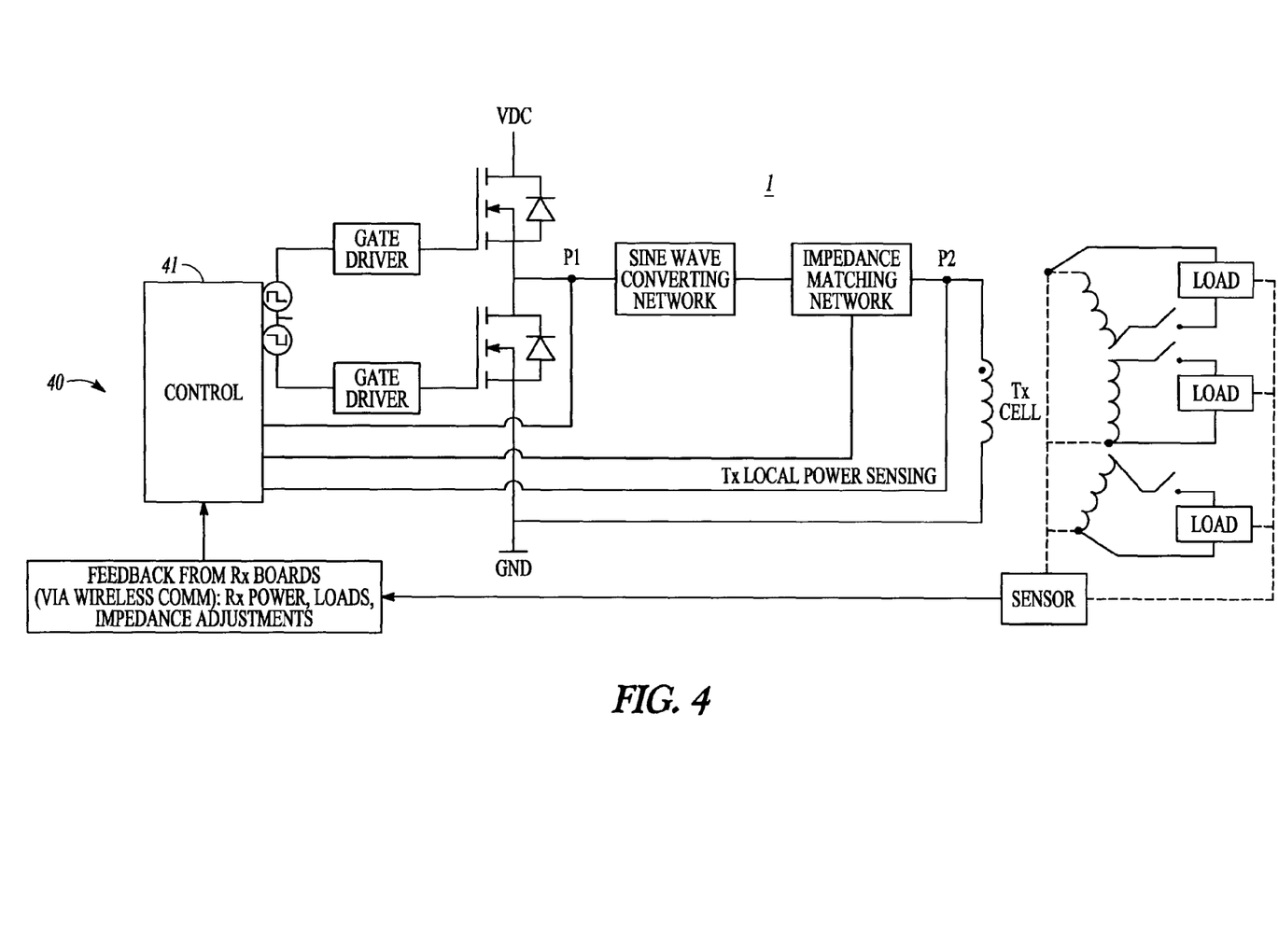
FIG. 4 illustrates an example active driving frequency sweeping and impedance tuning system (ADFS).

FIG. 4 illustrates an example active driving frequency sweeping and impedance tuning system (ADFS) 40 for an energy transfer system 1. The ADFS 40 may include a control 41 that forces the energy transfer system 1 to operate away from intrinsic frequency of the energy transfer system 1 to maximize Rx power and end-to-end efficiency when the energy transfer system 1 is operating outside of design parameters (e.g., under different loads and/or coupling as well as changing temperatures).

Figure 5:
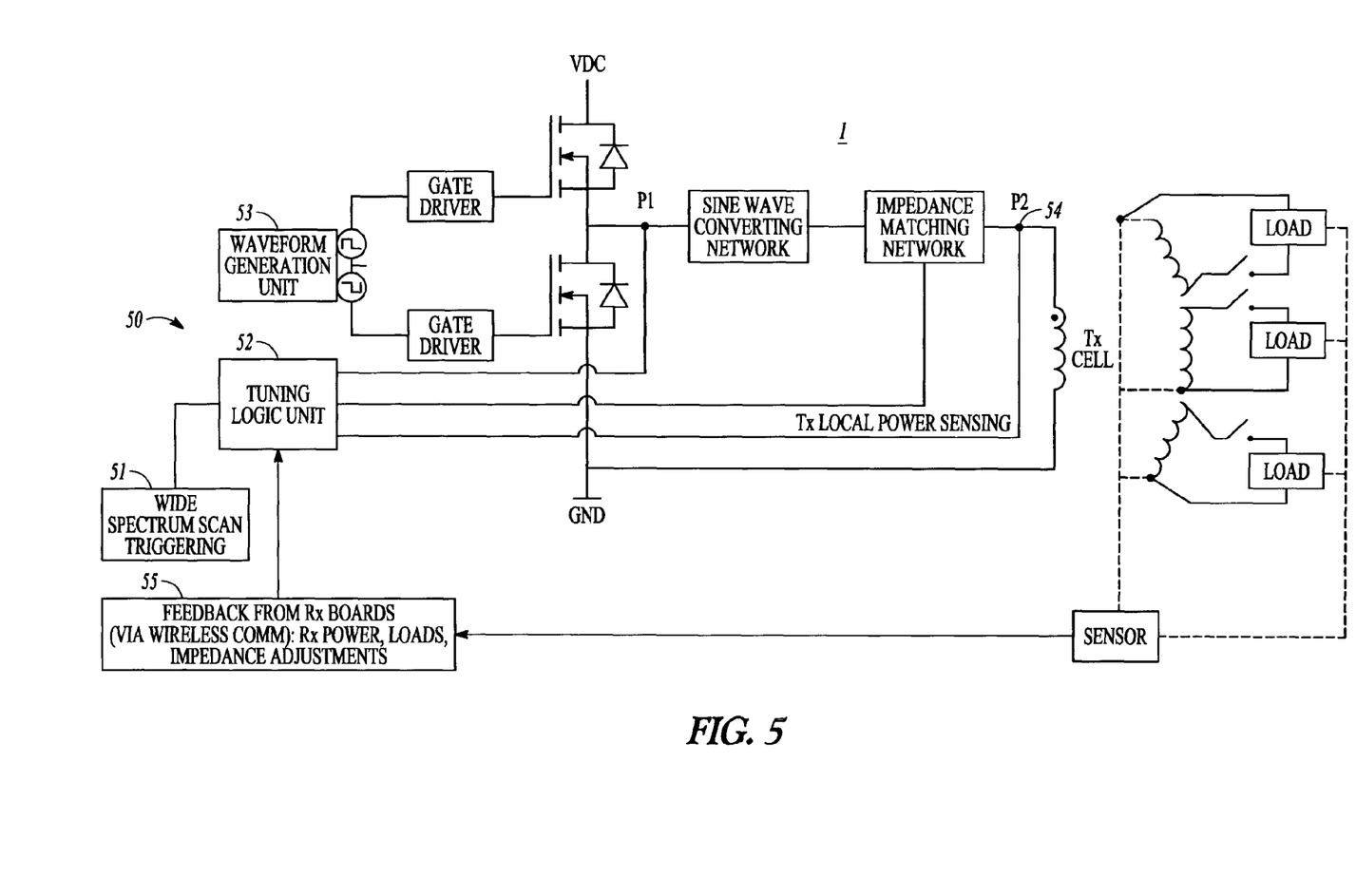
FIG. 5 illustrates another example active driving frequency sweeping and impedance tuning system (ADFS).

FIG. 5 illustrates another example active driving frequency sweeping and impedance tuning system (ADFS) 50 for the energy transfer system 1. The ADFS 50 includes a Wide Spectrum Scan Triggering (WSST) mechanism 51, a Tuning Logic Unit (TLU) 52 and a Waveform Generation Unit (WGU) 53. These three items may obtain data from a transmitting power phase and power sensing mechanism 54 and a receiving power phase and power sensing mechanism 55. In some forms, the receiving power phase and power sensing mechanism 55 may wirelessly communicate with one or more components that form the ADFS 50 (e.g., using Bluetooth Low Energy).

The ADFS 50 may compare transmitting power with receiving power to determine the current end to end efficiency the energy transfer system 1. The current end to end efficiency may determine whether the WSST 51 is triggered. As an example, if the measured system end to end efficiency is much lower than a set value, the energy transfer system 1 may be operating far enough away from the intrinsic frequency of the energy transfer system 1 such that the WSST 51 should be triggered.

The WSST 51 may then perform wide frequency sweeping (e.g., from +/−20% of the intrinsic frequency). In some forms, hierarchical sweeping may be put in for faster response. Hierarchical sweeping may start with coarse grain frequency resolution over a large frequency range. Once the proper operating frequency has been narrowed down, additional frequency sweeping may be performed at fine grain resolution to pinpoint an optimal operating frequency for the energy transfer system 1.

As an example, PLL may be used for final fine grain frequency tuning while programmable offset ranges are used for coarse grain tuning. In addition to driving frequency tuning, the WSST 51 may fine tune the transmitting power side impedance matching network for maximized end-to-end efficiency of the energy transfer system 1. The WSST 51 may match the transmitting power side impedance using the new operating frequency, new load and new impedance. The WSST 51 may perform the matching based on feedback from receiving power side.

The ADFS systems 40, 50 described herein may make a wireless energy transfer system that performs more efficiently under a variety of operating conditions.

Figure 6:
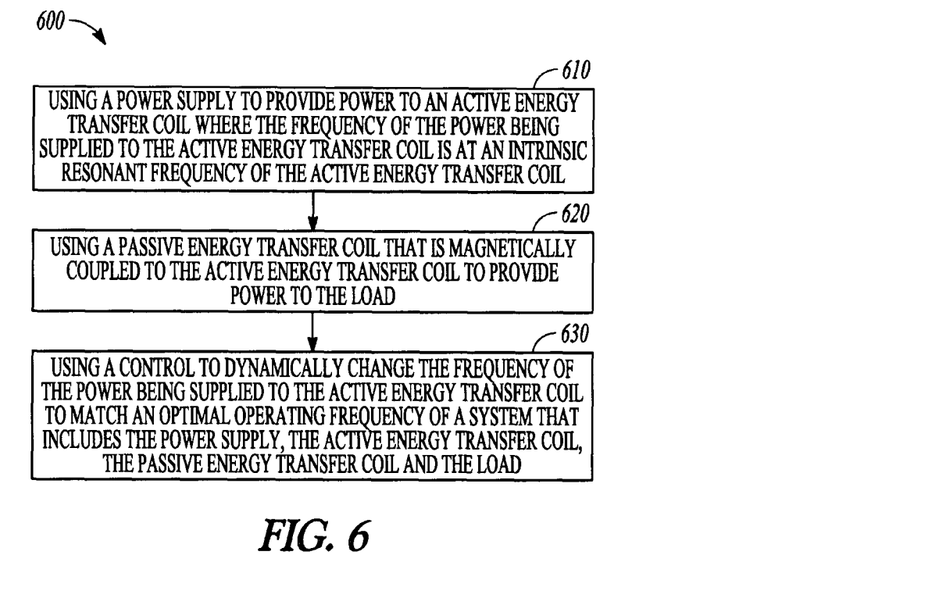
FIG. 6 is a flow diagram illustrating an example method of supplying power to a load.

FIG. 6 is a flow diagram illustrating an example method [600] of supplying power to a load. The method [600] includes [610] using a power supply to provide power to an active energy transfer coil where the frequency of the power being supplied to the active energy transfer coil is at an intrinsic resonant frequency of the active energy transfer coil. The method [600] further includes [620] using a passive energy transfer coil that is magnetically coupled to the active energy transfer coil to provide power to the load.

The method [600] further includes [630] using a control to dynamically change the frequency of the power being supplied to the active energy transfer coil to match an optimal operating frequency of a system that includes the power supply, the active energy transfer coil, the passive energy transfer coil and the load. In some forms of the method [600], [630] using a control to dynamically change the frequency of the power being supplied to the active energy transfer coil may include (i) identifying the optimal operating frequency of the system; (ii) matching the optimal operating frequencies of the power supply, the active energy transfer coil and the passive energy transfer coil; (iii) compensating for changes in the coupling between the active energy transfer coil and the passive energy transfer coil; (iv) compensating for changes in the load that receives power from the passive energy transfer coil; (v) changing the frequency of the power being supplied to the active energy transfer coil such that an output impedance of the power supply matches an operating impedance of the system; and/or (vi) compensating for manufacturing discrepancies within the system (among other factors).

Figure 7:
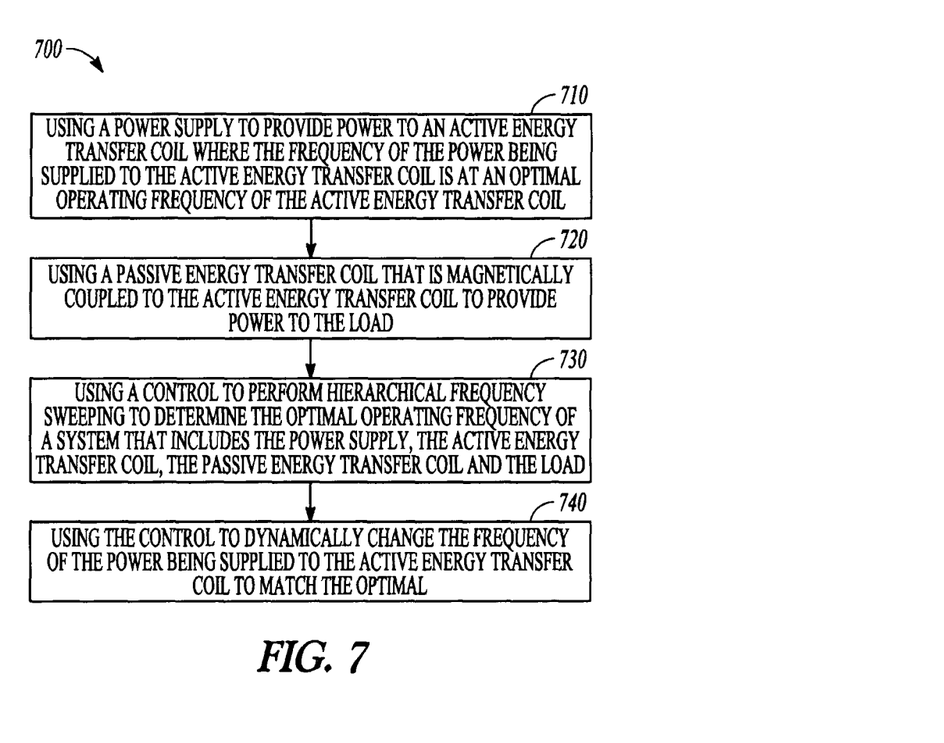
FIG. 7 is a flow diagram illustrating another example method of supplying power to a load.

FIG. 7 is a flow diagram illustrating another example method [700] of supplying power to a load. The method [700] includes [710] using a power supply to provide power to an active energy transfer coil where the frequency of the power being supplied to the active energy transfer coil is at an optimal operating frequency of the active energy transfer coil, and [720] using a passive energy transfer coil that is magnetically coupled to the active energy transfer coil to provide power to the load.

The method [700] further includes [730] using a control to perform hierarchical frequency sweeping to determine the optimal operating frequency of a system that includes the power supply, the active energy transfer coil, the passive energy transfer coil and the load. As an example, [730] using a control to perform hierarchical frequency sweeping to determine the optimal operating frequency of a system that includes the power supply, the active energy transfer coil, the passive energy transfer coil and the load may include performing hierarchical frequency sweeping at multiple levels of resolution. In addition, performing hierarchical frequency sweeping at multiple levels of resolution may include changing the optimal operating frequency using phase lock loop fine tuning once the appropriate level of resolution for the operating frequency has been determined using hierarchical frequency sweeping at multiple levels of resolution.

The method [700] further includes [740] using the control to dynamically change the frequency of the power being supplied to the active energy transfer coil to match the optimal operating frequency of the system. As an example, [740] using the control to dynamically change the frequency of the power being supplied to the active energy transfer coil may include using a power sensing mechanism to provide data to the control relating to the optimal operating frequency of the passive energy transfer coil.

In some forms of the method [700], [740] using the control to dynamically change the frequency of the power being supplied to the active energy transfer coil to match the optimal operating frequency of the system may include (i) using a wide spectrum scan triggering mechanism to perform a coarse grain operating frequency sweep over a relatively large frequency range (see, e.g., wide spectrum scan triggering mechanism 51 in FIG. 5); (ii) using a tuning logic unit to dynamically change the frequency of the power provided by the power supply (see, e.g., tuning logic unit 52 in FIG. 5); and/or (iii) using a waveform generation unit to dynamically change a frequency and a duty cycle of a digital control signal that operates the power supply (see, e.g., waveform generation unit 53 in FIG. 5).

Figure 8:
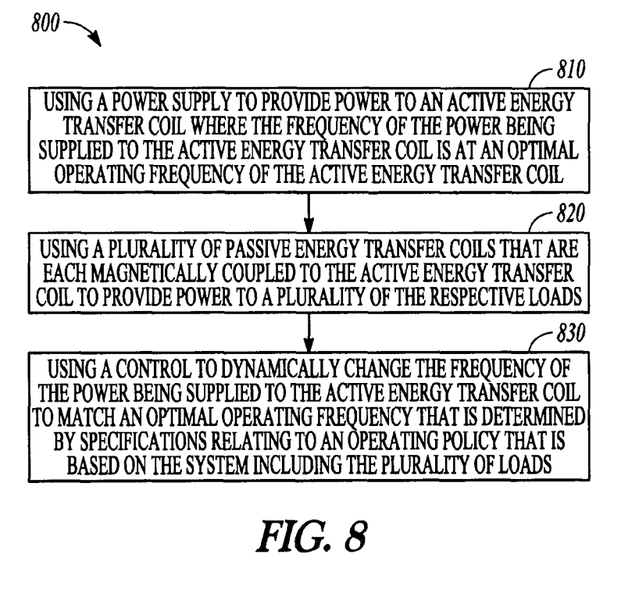
FIG. 8 is a flow diagram illustrating an example method of supplying power to a plurality of loads.

FIG. 8 is a flow diagram illustrating an example method [800] of supplying power to a plurality of loads. The method [800] includes [810] using a power supply to provide power to an active energy transfer coil where the frequency of the power being supplied to the active energy transfer coil is at an optimal operating frequency of the active energy transfer coil, and [820] using a plurality of passive energy transfer coils that are each magnetically coupled to the active energy transfer coil to provide power to a plurality of the respective loads.

The method [800] further includes [830] using a control to dynamically change the frequency of the power being supplied to the active energy transfer coil to match an optimal operating frequency that is determined by specifications relating to an operating policy that is based on the system including the plurality of loads. As an example, [830] using a control to dynamically change the frequency of the power being supplied to the active energy transfer coil may include using the control to dynamically change the frequency of the power being supplied to the active energy transfer coil to match an optimal operating frequency of the system that includes the power supply, the active energy transfer coil, the passive energy transfer coil and the plurality of loads.

In some forms of the method [800], [830] using a control to dynamically change the frequency of the power being supplied to the active energy transfer coil may include using the control to dynamically change the frequency of the power being supplied to the active energy transfer coil to match an optimal operating frequency of the system that includes the power supply, the active energy transfer coil, the passive energy transfer coil and some of the plurality of loads. As an example, some of the plurality of loads may include only one particular load, or any number of the loads.

Forms of the method [800] are contemplated where [830] using the control to dynamically change the frequency of the power being supplied to the active energy transfer coil may include using at least one sensor to monitor the plurality of loads to provide data to the control relating to an operating status of the plurality of loads. As an example, using at least one sensor to monitor the plurality of loads may include monitoring the received power for each load and/or the maximum allowed charging power for each load.

Figure 9:
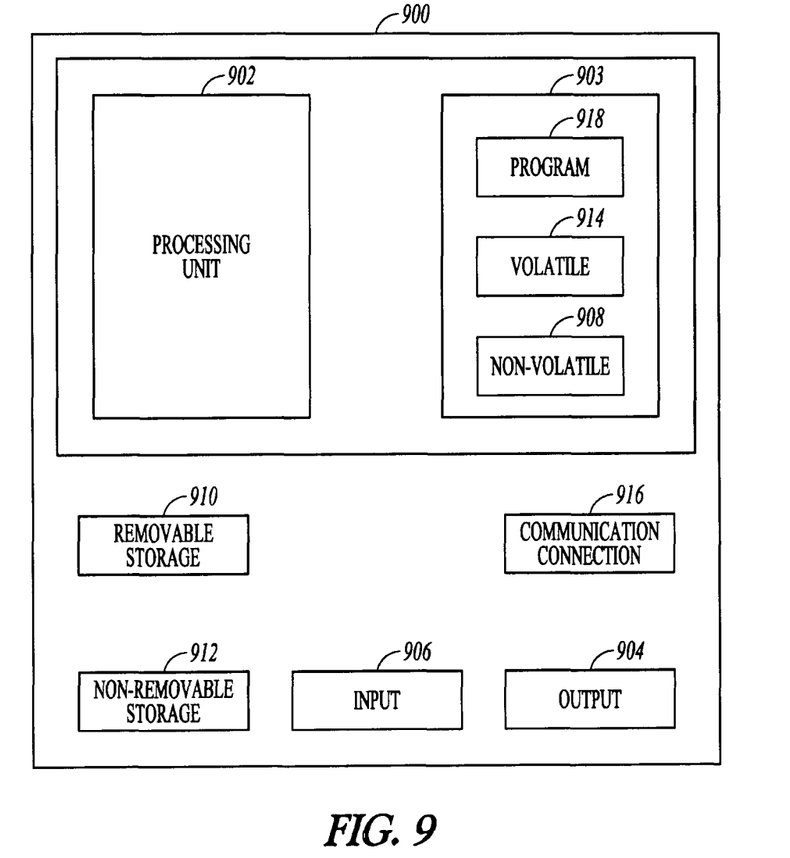
FIG. 9 is a block schematic diagram of a computer system 900 to implement control electronics according to the example methods described herein.

FIG. 9 is a block schematic diagram of a computer system 900 to implement control electronics according to the example methods described herein. The computer system 900 may also take the form of an integrated circuit or commercially available microprocessor or microcontroller having fewer components than shown in FIG. 9. One example computing device in the form of a computer 900 may include a processing unit 902, memory 903, removable storage 910, and non-removable storage 912. Memory 903 may include volatile memory 914 and non-volatile memory 908. Computer 900 may include—or have access to a computing environment that includes—a variety of computer-readable media, such as volatile memory 914 and non-volatile memory 908, removable storage 910 and non-removable storage 912. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 900 may include or have access to a computing environment that includes input 906, output 904, and a communication connection 915. The computer may operate in a networked environment using a communication connection to connect to one or more remote computers, such as database servers. The remote computer may include a personal computer (PC), server, router, network PC, a peer device or other common network node, or the like. The communication connection may include a Local Area Network (LAN), a Wide Area Network (WAN) or other networks.

Computer-readable instructions stored on a computer-readable medium are executable by the processing unit 902 of the computer 900. A hard drive, CD-ROM, and RAM are some examples of articles including a non-transitory computer-readable medium. For example, a computer program 918 capable of providing a generic technique to perform access control check for data access and/or for doing an operation on one of the servers in a component object model (COM) based system may be included on a CD-ROM and loaded from the CD-ROM to a hard drive. The computer-readable instructions allow computer 900 to provide generic access controls in a COM based computer network system having multiple users and servers.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the systems and methods described herein also contemplate examples in which only those elements shown or described are provided. Moreover, the systems and methods described herein also contemplate examples using any combination or permutation of those elements shown or described (or one or more aspects thereof), either with respect to a particular example (or one or more aspects thereof), or with respect to other examples (or one or more aspects thereof) shown or described herein.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile tangible computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and other storage devices.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72 (b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The claimed invention is:

1. A method of supplying power to a plurality of loads comprising:
   using a power supply to provide power to an active energy transfer coil where the frequency of the power being supplied to the active energy transfer coil is at an optimal operating frequency of the active energy transfer coil;
   using a plurality of passive energy transfer coils that are each magnetically coupled to the active energy transfer coil to provide power to a plurality of loads;

using at least one sensor to monitor the plurality of loads by monitoring received power for each load and maximum allowed charging power for each load; and using a computer system that includes control electronics to dynamically change the frequency of the power being supplied by the power supply to the active energy transfer coil to match an optimal operating frequency of a system that includes the power supply, the active energy transfer coil, the passive energy transfer coils and the plurality of loads.

2. The method of claim 1 wherein using the control to dynamically change the frequency of the power being supplied to the active energy transfer coil includes using at least one sensor to monitor the plurality of loads to provide data to the control relating to an operating status of the plurality of loads.

3. The method of claim 1 wherein using a control to dynamically change the frequency of the power being supplied to the active energy transfer coil includes compensating for changes in the coupling between the active energy transfer coil and the passive energy transfer coil.

4. The method of claim 1 wherein using the control to dynamically change the frequency of the power being supplied to the active energy transfer coil includes performing hierarchical frequency sweeping to determine the optimal operating frequency of the system.

5. The method of claim 4 wherein performing hierarchical frequency sweeping to determine the optimal operating resonant frequency of a system includes performing hierarchical frequency sweeping at multiple levels of resolution.

6. The method of claim 5 wherein performing hierarchical frequency sweeping at multiple levels of resolution includes changing the optimal operating frequency using phase lock loop fine tuning once the appropriate level of resolution for the operating frequency has been determined using hierarchical frequency sweeping at multiple levels of resolution.

7. The method of claim 6 wherein using the control to dynamically change the frequency of the power being supplied to the active energy transfer coil includes using a tuning logic unit to dynamically change the frequency of the power provided by the power supply.

8. The method of claim 5 wherein using the control to dynamically change the frequency of the power being supplied to the active energy transfer coil includes using a wide spectrum scan triggering mechanism to perform a coarse grain operating frequency sweep over a relatively large frequency range.

9. The method of claim 8 wherein using the control to dynamically change the frequency of the power being supplied to the active energy transfer coil includes using a waveform generation unit to dynamically change a frequency and a duty cycle of a digital control signal that operates the power supply.

* * * * *